United States Patent
Itoh et al.

(10) Patent No.: US 8,407,628 B2
(45) Date of Patent: Mar. 26, 2013

(54) PHOTOMASK MANUFACTURING METHOD AND SEMICONDUCTOR DEVICE MANUFACTURING METHOD

(75) Inventors: Masamitsu Itoh, Yokohama (JP);
Takashi Hirano, Kawasaki (JP);
Kazuya Fukuhara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 391 days.

(21) Appl. No.: 12/770,062

(22) Filed: Apr. 29, 2010

(65) Prior Publication Data

US 2010/0209829 A1  Aug. 19, 2010

Related U.S. Application Data

(62) Division of application No. 11/878,580, filed on Jul. 25, 2007, now Pat. No. 7,904,851.

(30) Foreign Application Priority Data

Jul. 25, 2006  (JP) .................................. 2006-202385

(51) Int. Cl.
*G06F 17/50* (2006.01)
*G03F 1/00* (2012.01)

(52) U.S. Cl. .................................. 716/50; 716/55; 430/5

(58) Field of Classification Search .................. 716/50, 716/55; 430/5
See application file for complete search history.

(56) References Cited

U.S. PATENT DOCUMENTS

| | | | |
|---|---|---|---|
| 6,497,982 B1 | 12/2002 | Wang | |
| 6,511,794 B1 | 1/2003 | Furukawa | |
| 6,566,016 B1 | 5/2003 | Ziger | |
| 6,656,341 B2 | 12/2003 | Petersson et al. | |
| 7,001,697 B2 | 2/2006 | Park et al. | |
| 7,563,547 B2 | 7/2009 | Park et al. | |
| 2003/0157415 A1* | 8/2003 | Ziger | ............... 430/5 |
| 2004/0081917 A1* | 4/2004 | Tanaka et al. | ............. 430/311 |
| 2005/0136341 A1 | 6/2005 | Park et al. | |
| 2007/0065729 A1* | 3/2007 | Zait et al. | .................. 430/5 |

FOREIGN PATENT DOCUMENTS

| | | |
|---|---|---|
| JP | 7-209850 | 8/1995 |
| JP | 9-149257 | 6/1997 |
| JP | 10-10700 | 1/1998 |
| JP | 10-32160 | 2/1998 |

(Continued)

OTHER PUBLICATIONS

Office Action issued by Taiwan Patent Office of Jun. 23, 2010, in Taiwan Patent Application No. 096124855, and English translation thereof.

(Continued)

*Primary Examiner* — Jack Chiang
*Assistant Examiner* — Magid Dimyan
(74) *Attorney, Agent, or Firm* — Finnegan, Henderson, Farabow, Garrett & Dunner, L.L.P.

(57) ABSTRACT

This invention discloses a photomask manufacturing method. A pattern dimensional map is generated by preparing a photomask in which a mask pattern is formed on a transparent substrate, and measuring a mask in-plane distribution of the pattern dimensions. A transmittance correction coefficient map is generated by dividing a pattern formation region into a plurality of subregions, and determining a transmittance correction coefficient for each of the plurality of subregions. The transmittance correction value of each subregion is calculated on the basis of the pattern dimensional map and the transmittance correction coefficient map. The transmittance of the transparent substrate corresponding to each subregion is changed on the basis of the transmittance correction value.

10 Claims, 4 Drawing Sheets

FOREIGN PATENT DOCUMENTS

| | | |
|---|---|---|
| JP | 2002-107909 | 4/2002 |
| JP | 2002-278040 | 9/2002 |
| JP | 2002-359184 | 12/2002 |
| JP | 2003-255510 | 9/2003 |
| JP | 2004-502308 | 1/2004 |
| JP | 2004-54092 | 2/2004 |
| JP | 2004-264779 | 9/2004 |
| JP | 2006-39557 | 2/2006 |
| WO | WO 2005/008333 | 1/2005 |

OTHER PUBLICATIONS

Japanese Patent Office's Decision of Rejection mailed Sep. 16, 2008 for Application No. 2006-202385.

Notice of Reasons for Rejection mailed from the Japanese Patent Office Jun. 26, 2008, for Application No. 2006-202385.

Notice of Reasons for Rejection mailed May 25, 2010, in corresponding Japanese Patent Application No. 2006-202385, and English translation thereof.

* cited by examiner

PHOTOMASK MANUFACTURING METHOD AND SEMICONDUCTOR DEVICE MANUFACTURING METHOD

CROSS-REFERENCE TO RELATED APPLICATIONS

This is a division of application Ser. No. 11/878,580, filed Jul. 25, 2007 now U.S. Pat. No. 7,904,851, which is based upon and claims the benefit of priority from prior Japanese Patent Application No. 2006-202385, filed Jul. 25, 2006, the entire contents of all of which are incorporated herein by reference.

BACKGROUND OF THE INVENTION

1. Field of the Invention

The present invention relates to a method of manufacturing a photomask having a mask pattern on a transparent substrate and, more particularly, to a method of manufacturing a photomask in which the transmittance of a transparent substrate changes depending on the position. The present invention also relates to a semiconductor device manufacturing method using a photomask manufactured by this method.

2. Description of the Related Art

Along with the recent advance in the micropatterning of semiconductor devices, a demand for micropatterning in the photolithography process is increasing. The design rule of leading-edge devices has already reduced the half pitch (hp) to 45 nm. An exposure technique using both immersion exposure and polarization illumination manages to cope with this micropatterning.

Under the circumstances, the dimensional uniformity required for a photomask is increasingly becoming stricter to the degree that the in-plane uniformity of the mask pattern dimensions must be 2 nm (3σ). To correct the mask pattern dimensions, a technique of changing the transmittance of a quartz substrate is available. This technique decreases the transmittance of quartz at a relatively large opening of the mask pattern within the mask plane. This allows an exposure apparatus to actually transfer a pattern having substantially desired dimensions onto a wafer. One approach capable of decreasing the transmittance of the quartz substrate is to form a fine heterogeneous layer in the substrate using a femto second laser to scatter exposure light by this heterogeneous layer (e.g., see A2 in PCT [WO] 2005/008333).

This approach adjusts the transmittance change amount of the quartz substrate while maintaining the relationship with the mask in-plane dimensional distribution constant. More specifically, this approach defines the transmittance change amount as 1% when the dimensions on the mask are shifted from a desired value by 1 nm, and maintains this relationship between the dimensions on the mask and the transmittance constant within the mask plane. That is, this approach decreases by 3% the transmittance of quartz at an opening that is larger than a desired value of the dimensions on the mask by 3 nm.

The relationship between the dimensions on the mask and the transmittance (to be referred to as the transmittance correction coefficient hereinafter) is generally adjusted for a finest pattern called a cell portion. However, it has begun to be understood that since not only fine patterns but also rough patterns are present on the mask, the adjustment of the transmittance correction coefficient for the cell portion results in overcorrection in some regions. This is because a finer pattern suffers a larger dimensional fluctuation on the wafer relative to the dimensional fluctuation on the mask, and therefore has a larger value of a so-called mask error enhancement factor (MEF).

The MEF is given by:

$$\text{MEF} = (\text{mask magnification}) \times (\text{dimensional fluctuation on wafer})/(\text{dimensional fluctuation on mask}) \qquad (1)$$

As the current wafer exposure apparatus adopts ¼ reduction transfer, the mask magnification is normally 4. When a pattern to be transferred is sufficiently larger than the exposure wavelength, the MEF becomes almost 1. In this case, the dimensional fluctuation on the wafer is equivalent to ¼ that on the mask. This is because the wafer exposure apparatus adopts ¼ reduction transfer.

However, the recent lithography process of forming a micropattern equal to or smaller than the exposure wavelength uses an MEF of 2 or more to be more sensitive to the dimensional fluctuation on the mask. For example, a fine pattern need only undergo transmittance correction by 1% per nm, while a rough pattern need only undergo transmittance correction by 0.5% per nm. Hence, the adjustment of the transmittance correction coefficient for a fine pattern results in overcorrection of a rough pattern.

As described above, the conventional method of changing the transmittance of a quartz substrate to correct the pattern dimensions of a mask cannot accurately correct the transmittance because the MEF value changes depending on the pattern dimensions.

BRIEF SUMMARY OF THE INVENTION

According to an aspect of the present invention, there is provided a photomask manufacturing method comprising:

preparing a photomask in which a mask pattern is formed on a transparent substrate;

generating a pattern dimensional map by measuring a mask in-plane distribution of pattern dimensions;

generating a transmittance correction coefficient map by dividing a formation region of the pattern into a plurality of subregions and determining a transmittance correction coefficient for each subregion in accordance with a size of a pattern of said each subregion;

calculating a transmittance correction value of said each subregion on the basis of the pattern dimensional map and the transmittance correction coefficient map; and changing a transmittance of the transparent substrate corresponding to said each subregion on the basis of the transmittance correction value.

According to another aspect of the present invention, there is provided a photomask manufacturing method comprising:

preparing a photomask in which a mask pattern formed from a halftone film is formed on a transparent substrate;

generating a transmittance correction coefficient map by dividing a formation region of the pattern into a plurality of subregions, calculating, for each subregion, a mask error enhancement factor indicating, when the pattern of the photomask is transferred onto a semiconductor wafer, a relationship between a dimensional fluctuation on the mask and a dimensional fluctuation on the wafer, selecting and using, as an MEF value indicating the mask error enhancement factor, a maximum MEF value of a plurality of patterns within each subregion, and determining a transmittance correction coefficient of said each subregion on the basis of the selected maximum MEF value;

generating a pattern dimensional map indicating a mask in-plane distribution of pattern dimensions by measuring the dimensions of the pattern for each subregion that is larger than the subregions divided in determining the transmittance correction coefficients;

calculating a transmittance correction value of said each subregion on the basis of the pattern dimensional map and the transmittance correction coefficient map; and changing a transmittance of the transparent substrate corresponding to said each subregion on the basis of the transmittance correction value.

According to still another aspect of the present invention, there is provided a semiconductor device manufacturing method comprising:

preparing a photomask in which a mask pattern is formed on a transparent substrate;

generating a pattern dimensional map by measuring a mask in-plane distribution of pattern dimensions;

generating a transmittance correction coefficient map by dividing a formation region of the pattern into a plurality of subregions and determining a transmittance correction coefficient for each subregion in accordance with a size of a pattern of said each subregion;

calculating a transmittance correction value of said each subregion on the basis of the pattern dimensional map and the transmittance correction coefficient map;

changing a transmittance of the transparent substrate corresponding to said each subregion on the basis of the transmittance correction value; and transferring the pattern of the photomask onto a wafer using the photomask whose transmittance of the transparent substrate is changed.

DETAILED DESCRIPTION OF THE INVENTION

Embodiments of the present invention will be described in detail below with reference to the accompanying drawing.

First Embodiment

Figure 1:
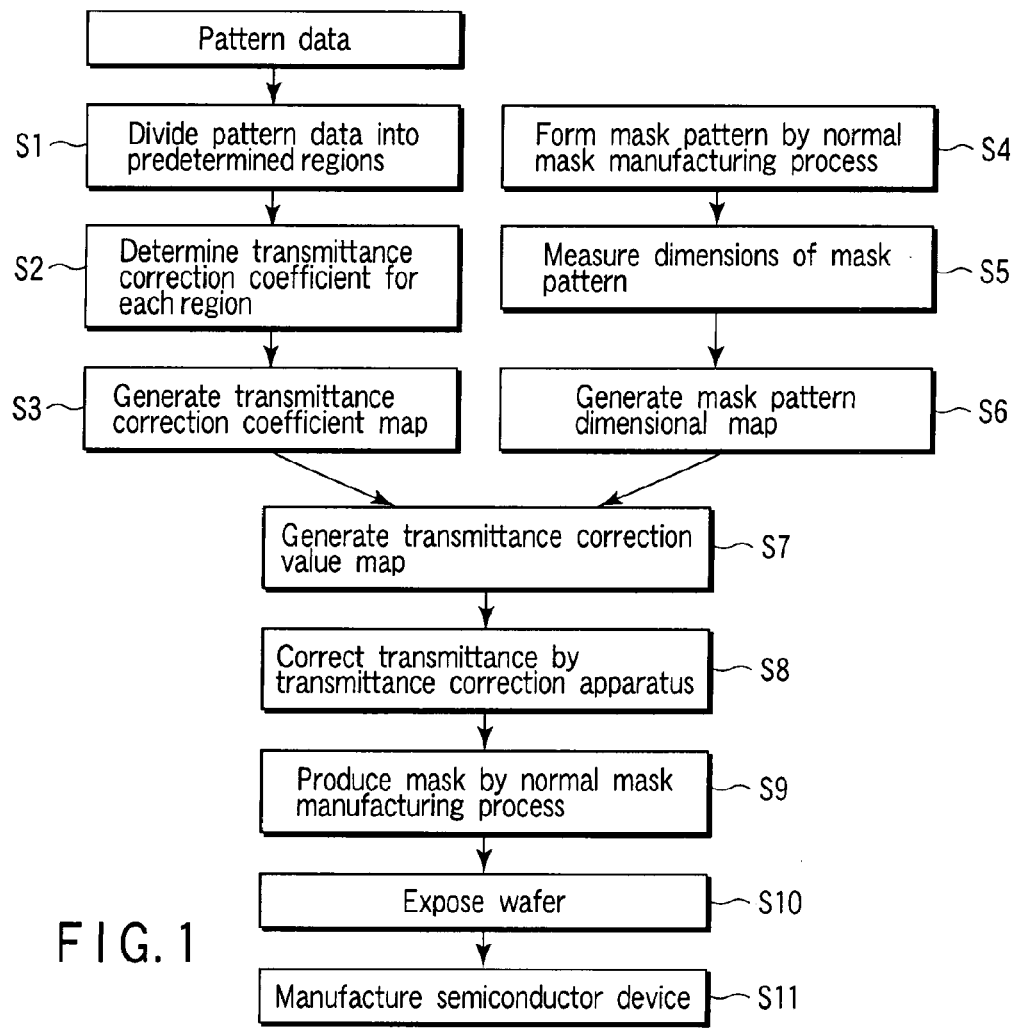
FIG. 1 is a flowchart showing a photomask manufacturing process according to the first embodiment.

FIG. 1 is a flowchart for explaining a photomask manufacturing method according to the first embodiment of the present invention. FIG. 1 shows a process until a semiconductor device is manufactured after photomask manufacture.

Figure 2:
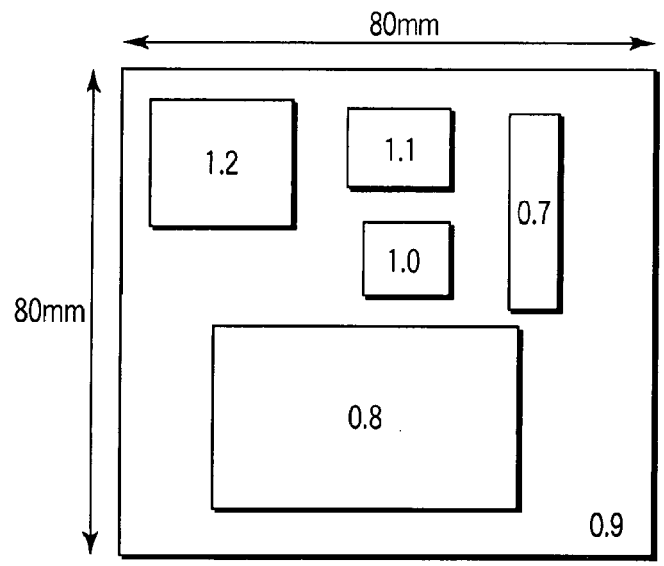
FIG. 2 is a view illustrating an example of a transmittance correction coefficient map used in the first embodiment.

First, 80-mm-square pattern data to be formed on a mask was divided into 500-μm-square regions (step S1). A transmittance correction coefficient was determined for each region (step S2). A transmittance correction coefficient map as shown in FIG. 2 was generated (step S3). The transmittance correction coefficient was determined depending on the pattern size. More specifically, the transmittance correction coefficient was calculated using the average pattern pitch within the 500-μm-square region. The narrower the pattern pitch, the larger the transmittance correction coefficient.

Figure 3A:
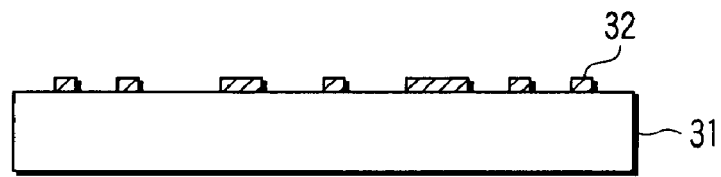
FIGS. 3A to 3C are views showing a process from photomask formation until pattern transfer.

Next, as shown in FIG. 3A, an ArF halftone (HT) pattern 32 made of MoSiON was formed, as a mask pattern, on a quartz substrate 31 serving as a transparent substrate by the normal mask manufacturing process (step S4). The photomask thus manufactured had already undergone defect inspection and defect correction. A scanning electron microscope (SEM) measured the dimensions of the formed HT pattern (step S5). 441 points within the 80-mm-square pattern were measured at a pitch of 4 mm. On the basis of this measurement data, an 80-mm-square pattern dimensional map as shown in FIG. 4 was generated (step S6).

This pattern dimensional map describes not the pattern dimension values themselves but the relative values of an actual pattern to a desired pattern. This is because the principle of transmittance correction can decrease the transmittance but cannot increase it. More specifically, this map uses pattern measurement values at which the HT-omitted pattern dimension (i.e., the width of a pattern without any HT) is minimum as a reference. That is, this map describes all the values with positive signs. The larger the value, the larger the HT-omitted pattern dimension.

Figure 4:
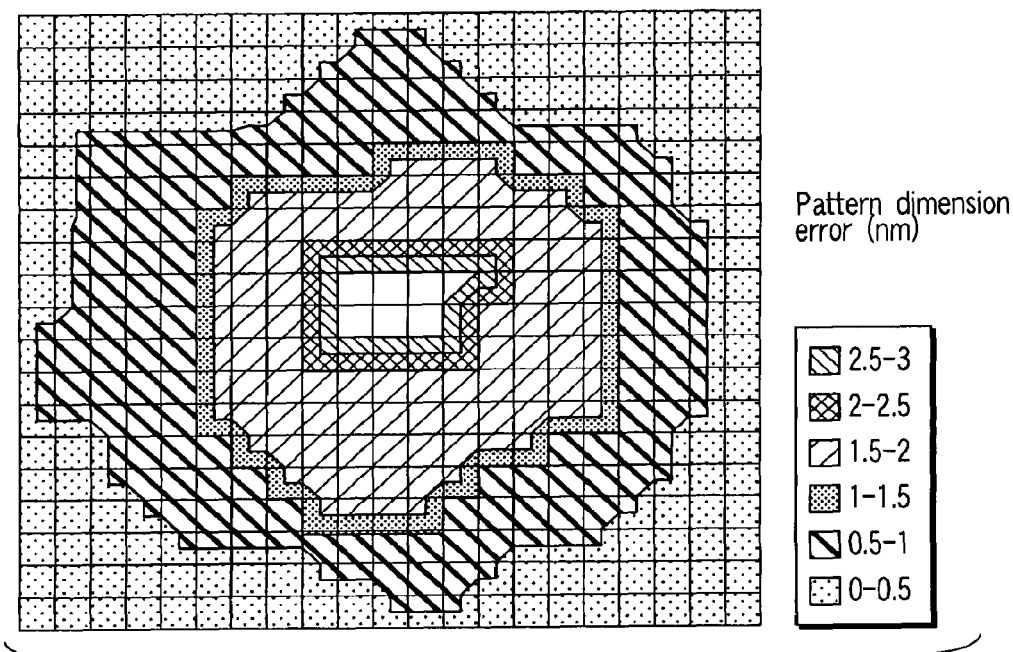
FIG. 4 is a view illustrating an example of a pattern dimensional map used in the first embodiment.
Figure 5:
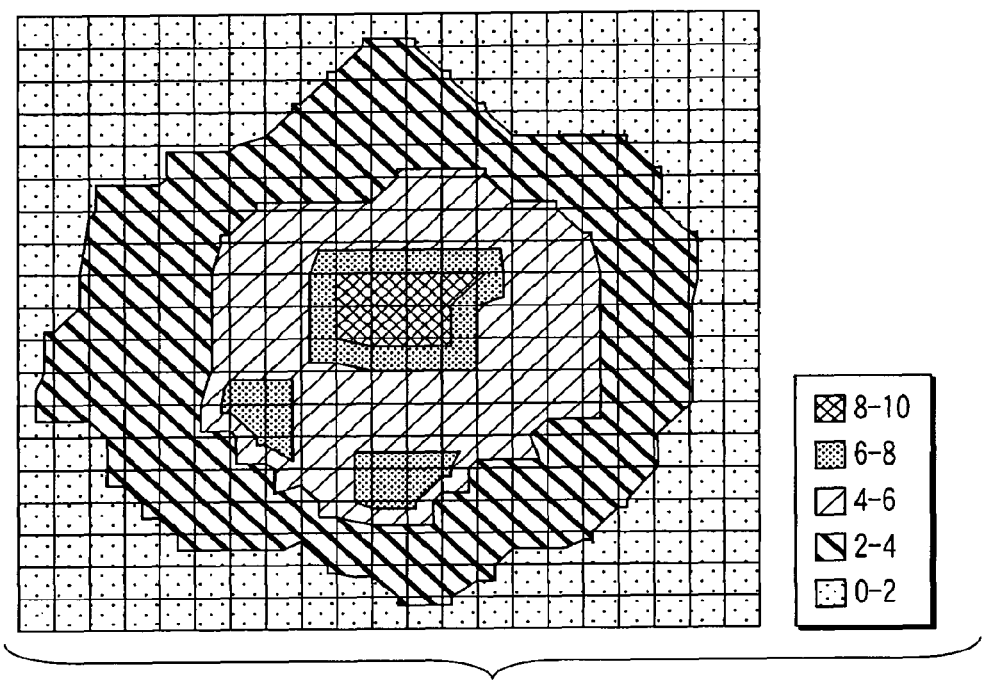
FIG. 5 is a view illustrating an example of a transmittance correction value map used in the first embodiment.

On the basis of the transmittance correction coefficient map shown in FIG. 2 and the pattern dimensional map shown in FIG. 4, a transmittance correction value was determined for each 500-μm-square region (step S7). That is, a transmittance correction value was calculated by multiplying the transmittance correction coefficient of an arbitrary 500-μm-square region divided as the transmittance correction coefficient map by the pattern dimension difference of the pattern dimensional map corresponding to this region. A transmittance correction value map as shown in FIG. 5 was thus generated. The value of this correction value map indicates the amount of transmittance to be decreased. For example, if the transmittance correction value is 5, the transmittance decreases by 5%. The measurement points on the pattern dimensional map are spaced apart at a pitch of 4 mm, so this is inconsistent with the region size of 500 μm. Therefore, the intervals between the measurement points were interpolated by an interpolation method.

Figure 3B:
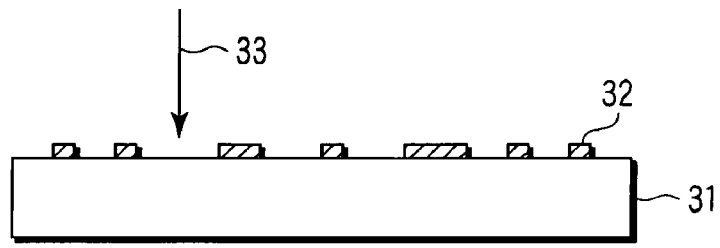

As shown in FIG. 3B, a laser beam 33 is guided onto the quartz substrate 31 to partially decrease its transmittance (step S8). More specifically, using a laser transmittance correction apparatus (PCT [WO] 2005/008333), a heterogeneous layer having a refractive index different from that of the quartz substrate 31 was formed in it by femto second laser beam irradiation to decrease its transmittance. At this time, the transmittance correction apparatus (CDC) read the transmittance correction value map to decrease the transmittance by following the transmittance correction value map.

Figure 3C:
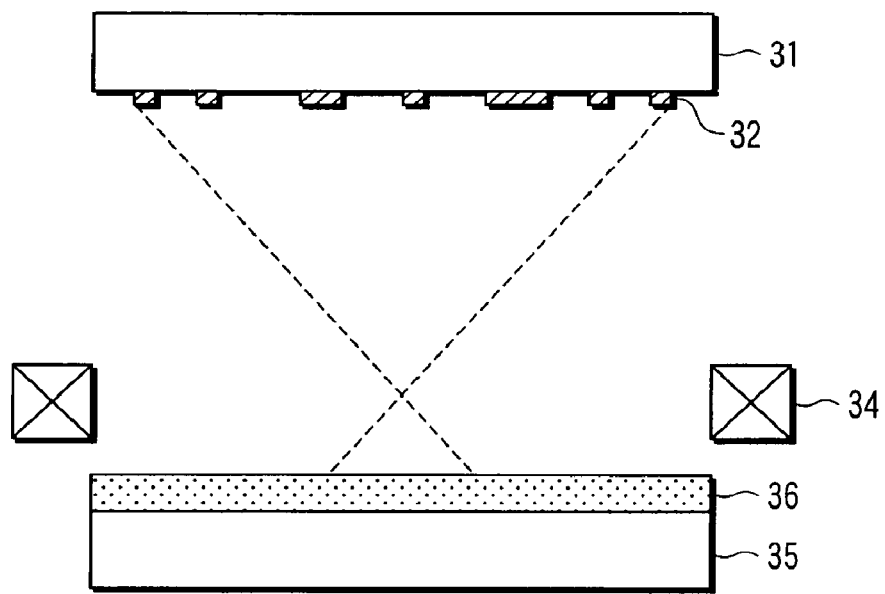

Using the normal photomask manufacturing process, the mask underwent cleaning and pellicle adhesion to complete a photomask (step S9). As shown in FIG. 3C, using this photomask, a pattern was reduced and transferred onto a resist 36 on a wafer 35 via a projection lens 34 (step S10). More specifically, this photomask was set on an immersion exposure apparatus to transfer a device pattern having a half pitch of 45 nm onto the resist 36 on the wafer 35. Furthermore, the wafer 35 was etched using the resist 36 as a mask to manufacture a semiconductor device (step S11). Consequently, the uniformity of the pattern dimensions improved as compared with the prior art. This increased the margin of lithography to be able to greatly improve the semiconductor device manufacturing yield.

According to the first embodiment, a transmittance correction coefficient map is generated for each predetermined region within the mask plane, and also a pattern dimensional map within the mask plane is generated. The correction value of each transmittance correction region is calculated on the basis of the transmittance correction coefficient map and pattern dimensional map. This makes it possible to correct the transmittance of the quartz substrate with a higher accuracy than in the prior art. It is therefore possible to manufacture a very fine semiconductor device having an hp as narrow as 45 nm or less with a high yield.

Second Embodiment

Figure 6:
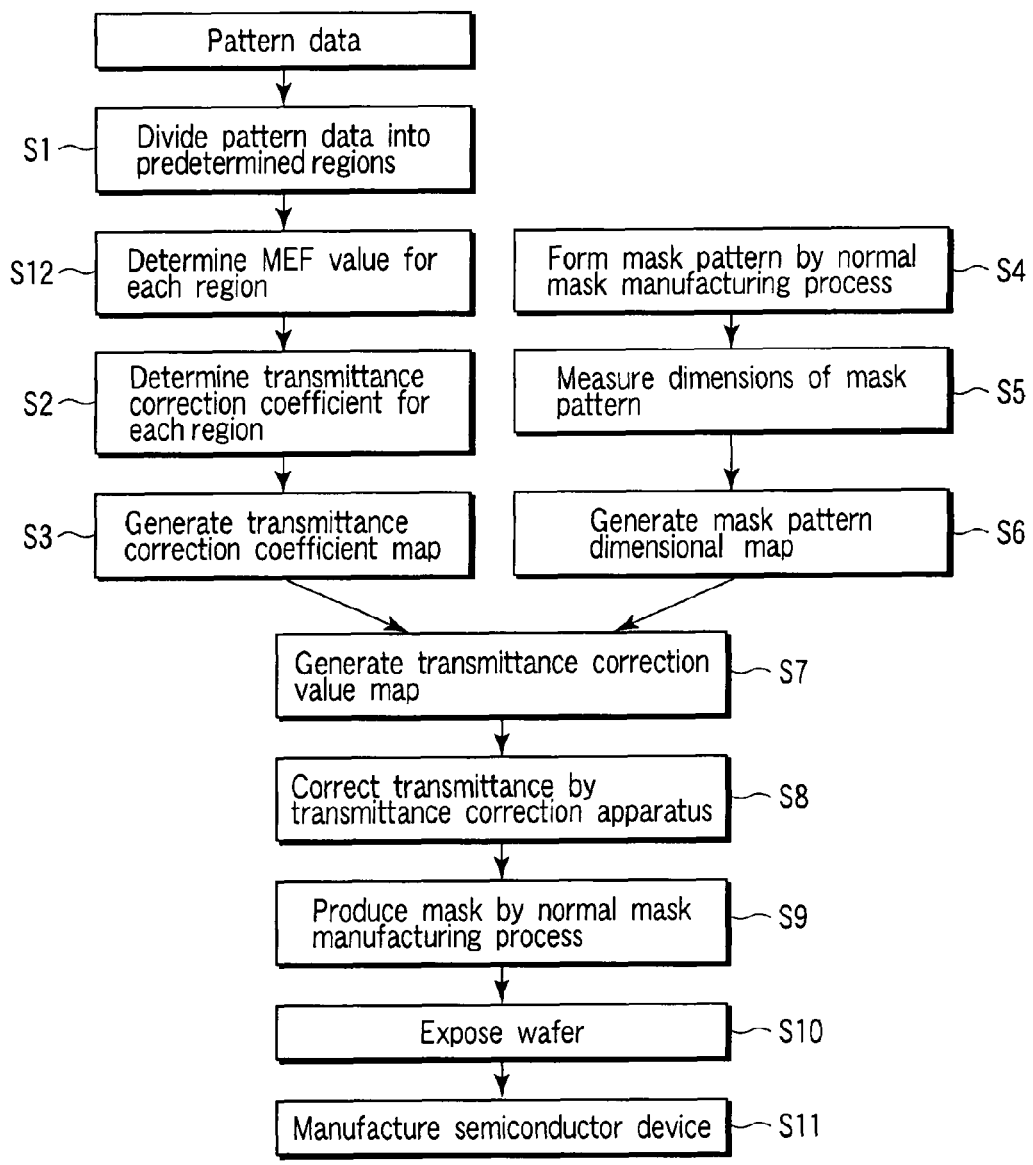
FIG. 6 is a flowchart showing a photomask manufacturing process according to the second embodiment.

FIG. 6 is a flowchart for explaining a photomask manufacturing method according to the second embodiment of the present invention. The basic process of the second embodiment is the same as that of the first embodiment. The second embodiment is different from the first embodiment in determining a transmittance correction coefficient on the basis of an MEF value set for each region.

In the second embodiment, as in the first embodiment, first, 80-mm-square pattern data to be formed on a mask was divided into 500-µm-square regions (step S1). A maximum MEF value within each region was determined as its MEF value (step S12). Transmittance correction coefficients as shown in FIG. 2 were determined on the basis of these MEF values (step S2). The relationship between the MEF value and the transmittance correction coefficient is uniquely determined and generally expressed by a linear equation. That is, $$\text{(transmittance correction coefficient)} = A \times \text{(MEF value)} + B \quad (2)$$

where A and B are preset constants. A transmittance correction coefficient map was generated on the basis of the determined transmittance correction coefficients of the respective regions (step S3).

Next, an ArF HT pattern made of MoSiON was formed on a quartz substrate by the normal mask manufacturing process (step S4). This photomask had already undergone defect inspection and defect correction. An SEM measured the dimensions of the formed HT pattern (step S5). 441 points within the 80-mm-square pattern were measured at a pitch of 4 mm. On the basis of this measurement data, an 80-mm-square pattern dimensional map as shown in FIG. 4 was generated (step S6).

On the basis of the transmittance correction coefficient map shown in FIG. 2 and the pattern dimensional map shown in FIG. 4, a transmittance correction value was determined for each 500-µm-square region (step S7). Subsequently, as in the first embodiment, the transmittance was decreased by following the transmittance correction value map using a laser transmittance correction apparatus (CDC) (step S8).

As in the first embodiment, using the normal photomask manufacturing process, the mask underwent cleaning and pellicle adhesion to complete a photomask (step S9). This photomask was set on an immersion exposure apparatus to transfer a device pattern having a half pitch of 45 nm onto a resist (step S10). Furthermore, the wafer was etched using the resist as a mask to manufacture a semiconductor device (step S11). Consequently, the uniformity of the pattern dimensions improved as compared with the prior art. This increased the margin of lithography to be able to greatly improve the semiconductor device manufacturing yield.

According to the second embodiment, in addition to the first embodiment, the MEF of each predetermined region within the mask plane is calculated to determine the relationship between the MEF value and the transmittance correction coefficient in advance. This makes it possible to correct the transmittance of the quartz substrate with a higher accuracy than in the first embodiment. It is therefore possible to manufacture a very fine semiconductor device having an hp as narrow as 45 nm or less with a high yield.

Third Embodiment

The third embodiment of the present invention will be explained. This embodiment is basically the same as the second embodiment but uses ion implantation in place of laser beam irradiation to perform transmittance correction.

In the third embodiment, first, 80-mm-square pattern data to be formed on a mask was divided into 1-mm-square regions to determine an MEF value for each region. The intermediate value between a maximum MEF value and the average MEF value within each region was determined as its MEF value. Transmittance correction coefficients were determined on the basis of these MEF values. A transmittance correction coefficient map as shown in FIG. 2 was generated on the basis of the transmittance correction coefficients of the respective regions, in the same manner as in the second embodiment.

Next, an ArF halftone (HT) pattern made of MoSiON was formed on a quartz substrate by the normal mask manufacturing process. This photomask had already undergone defect inspection and defect correction. An SEM measured the dimensions of the formed HT pattern. 441 points within the 80-mm-square pattern were measured at a pitch of 4 mm. On the basis of this measurement data, an 80-mm-square pattern dimensional map as shown in FIG. 4 was generated. This pattern dimensional map describes not the pattern dimensional values themselves but relative values.

On the basis of the transmittance correction coefficient map shown in FIG. 2 and the pattern dimensional map shown in FIG. 4, a transmittance correction value was determined for each 1-mm-square region. In the third embodiment, transmittance correction was performed by implanting ions into the quartz substrate. The implanted ions are Ga ions. The ion implantation amount is changed for each 1-mm-square region in the range of $2 \times 10^{14}$ to $2 \times 10^{16}$ ions/cm$^2$ to decrease the transmittance by following the transmittance correction value map. The inventors of the present invention experimentally confirmed that implanting Ga ions of about $10^{15}$ ions/cm$^2$ into the quartz substrate decreased the transmittance by about 15%.

Using the normal photomask manufacturing process, the mask underwent cleaning and pellicle adhesion to complete a photomask. This photomask was set on an immersion exposure apparatus to transfer a device pattern having a half pitch of 45 nm onto a resist. Then, it was confirmed that the uniformity of the pattern dimensions improved as compared with the prior art. This increased the margin of lithography to be able to greatly improve the semiconductor device manufacturing yield.

According to the third embodiment, it is possible to obtain not only the same effect as that of the second embodiment but also the following effect. That is, using ion implantation for transmittance correction makes it possible to set the amount of decrease in transmittance by the ion implantation amount with ease and high controllability. This also makes it possible to more accurately correct the transmittance of the quartz substrate. The Ga ion does not make the corrected transmittance of the quartz substrate unstable. That is, even when a wafer exposure apparatus irradiates the mask having undergone transmittance correction with an ArF excimer laser beam, the Ga ion can semipermanently maintain the corrected transmittance at the same level. Furthermore, a change in the flatness of the mask before and after ion implantation is as small as 20 nm or less, so a Ga ion is very suitable for transmittance correction.

MODIFICATION

The present invention is not particularly limited to the above-described embodiments. For example, it is possible to appropriately select the average MEF value of a plurality of patterns within each region, a maximum MEF value, or the intermediate MEF value between the average MEF value and the maximum MEF value. Alternatively, the MEF value of a representative pattern (an important pattern whose dimensions are strictly managed) within each region may be selected. The inventors of the present invention confirmed that the use of a maximum MEF value is likely to result in slight overcorrection, while the use of the average MEF value is likely to result in slight undercorrection. Hence, the use of the intermediate MEF value between the average MEF value and the maximum MEF value is preferable.

Although the above-described embodiments have exemplified the case wherein a halftone pattern is used as the mask pattern, a pattern formed from only a normal light-shielding film may be used. The method of decreasing the transmittance of a quartz substrate is also not particularly limited to a femto second laser or ion implantation as long as energy beam irradiation partially decreases its transmittance. The transparent substrate is also not particularly limited to a quartz substrate as long as it exhibits a sufficiently high transmittance with respect to exposure light. The ions implanted into the transparent substrate to decrease its transmittance are also not particularly limited to Ga ions, and can use other ions such as xenon ions.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photomask manufacturing method comprising:
    preparing a photomask in which a mask pattern is formed on a transparent substrate;
    generating a pattern dimensional map by measuring a mask in-plane distribution of pattern dimensions;
    generating a transmittance correction coefficient map by dividing a formation region of the pattern into a plurality of subregions and determining a transmittance correction coefficient for each subregion in accordance with a size of a pattern of said each subregion;
    calculating a transmittance correction value of said each subregion on the basis of the pattern dimensional map and the transmittance correction coefficient map; and
    changing a transmittance of the transparent substrate corresponding to said each subregion on the basis of the transmittance correction value.

2. A method according to claim 1, wherein the mask pattern includes one of a halftone pattern and a light-shielding pattern.

3. A method according to claim 1, wherein the transmittance correction coefficient is determined in accordance with an average pattern pitch within each of the plurality of divided subregions.

4. A method according to claim 1, wherein to generate the transmittance correction coefficient map, a mask error enhancement factor indicating, when the pattern of the photomask is transferred onto a semiconductor wafer, a relationship between a dimensional fluctuation on the mask and a dimensional fluctuation on the wafer is calculated to determine the transmittance correction coefficient of said each subregion on the basis of the mask error enhancement factor.

5. A method according to claim 4, wherein one of an average Mask Error Enhancement Factor (MEF) value of a plurality of patterns within each of the plurality of divided subregions, a maximum MEF value, and an intermediate MEF value between the average MEF value and the maximum MEF value is selected and used as an MEF value indicating the mask error enhancement factor.

6. A method according to claim 3, wherein to generate the pattern dimensional map, the dimensions of the pattern are measured for each subregion that is larger than the subregions divided in determining the transmittance correction coefficients.

7. A method according to claim 1, wherein to change the transmittance of the transparent substrate, a heterogeneous region is formed in the transparent substrate by irradiating the transparent substrate with a laser beam.

8. A method according to claim 1, wherein to change the transmittance of the transparent substrate, ions are implanted into the transparent substrate by an ion implantation method.

9. The method according to claim 1, wherein the pattern dimension map describes a relative value of an actual pattern to a desired pattern.

10. A photomask manufacturing method comprising:
    preparing a photomask in which a mask pattern formed from a halftone film is formed on a transparent substrate;
    generating a transmittance correction coefficient map by dividing a formation region of the pattern into a plurality of subregions, calculating, for each subregion, a mask error enhancement factor indicating, when the pattern of the photomask is transferred onto a semiconductor wafer, a relationship between a dimensional fluctuation on the mask and a dimensional fluctuation on the wafer, selecting and using, as a Mask Error Enhancement Factor (MEF) value indicating the mask error enhancement factor, a maximum MEF value of a plurality of patterns within each subregion, and determining a transmittance correction coefficient of said each subregion on the basis of the selected maximum MEF value;
    generating a pattern dimensional map indicating a mask in-plane distribution of pattern dimensions by measuring the dimensions of the pattern for each subregion that is larger than the subregions divided in determining the transmittance correction coefficients;
    calculating a transmittance correction value of said each subregion on the basis of the pattern dimensional map and the transmittance correction coefficient map; and
    changing a transmittance of the transparent substrate corresponding to said each subregion on the basis of the transmittance correction value.

* * * * *